United States Patent
Hsiao et al.

(10) Patent No.: US 11,227,705 B2
(45) Date of Patent: Jan. 18, 2022

(54) CIRCUIT BOARD ASSEMBLY AND CABLE

(71) Applicant: Bizlink International Corporation, New Taipei (TW)

(72) Inventors: Hsin Tuan Hsiao, New Taipei (TW); Chih Feng Cheng, New Taipei (TW)

(73) Assignee: Bizlink International Corporation, New Taipei (TW)

( * ) Notice: Subject to any disclaimer, the term of this patent is extended or adjusted under 35 U.S.C. 154(b) by 0 days.

(21) Appl. No.: 17/000,446

(22) Filed: Aug. 24, 2020

(65) Prior Publication Data

US 2021/0065932 A1 Mar. 4, 2021

(30) Foreign Application Priority Data

Aug. 28, 2019 (TW) .................................. 108130775

(51) Int. Cl.
*H01B 11/00* (2006.01)
*H01B 7/08* (2006.01)
(Continued)

(52) U.S. Cl.
CPC ......... *H01B 11/002* (2013.01); *H01B 7/0807* (2013.01); *H01B 7/0823* (2013.01);
(Continued)

(58) Field of Classification Search
CPC . H01B 11/002; H01B 11/01091; H01B 11/12; H01B 13/06; H01B 7/0823; H01B 7/0807; H01R 12/53; H05K 1/0243
See application file for complete search history.

(56) References Cited

U.S. PATENT DOCUMENTS 3,980,382 A * 9/1976 Reeder ................. H01R 9/0515
439/581
5,872,334 A * 2/1999 Trazyik ................ H01B 11/203
174/36
(Continued)

FOREIGN PATENT DOCUMENTS

TW 590316 U 6/2004
TW M242835 U 9/2004
(Continued)

*Primary Examiner* — William H. Mayo, III
*Assistant Examiner* — Rhadames Alonzo Miller
(74) *Attorney, Agent, or Firm* — Karin L. Williams; Alan D. Kamrath; Mayer & Williams PC

(57) ABSTRACT

A circuit board assembly has a circuit board and a high-speed cable. The high-speed cable has two signal lines, a ground conductor, an impedance-reducing conductor, and a covering material. The signal lines, the ground conductor, and the impedance-reducing conductor are mounted through the entire high-speed cable. The covering material wraps the signal lines, the ground conductor, and the impedance-reducing conductor, and has a conductive layer and an isolation layer as an inner layer and an outer layer respectively. The conductive layer has multiple loops electrically connected to the ground conductor and the impedance-reducing conductor. Thus, the impedance in the covering material, the ground conductor, and the impedance-reducing conductor is decreased, which prevents from attenuating the signal intensity during transmission at high frequency.

7 Claims, 9 Drawing Sheets

(51) Int. Cl.
*H05K 1/02* (2006.01)
*H01B 13/06* (2006.01)
*H01R 12/53* (2011.01)

(52) U.S. Cl.
CPC .............. *H01B 13/06* (2013.01); *H01R 12/53* (2013.01); *H05K 1/0243* (2013.01)

(56) References Cited

U.S. PATENT DOCUMENTS

| | | | | |
|---|---|---|---|---|
| 6,010,788 | A * | 1/2000 | Kebabjian | H01B 11/002 174/102 R |
| 6,380,485 | B1 * | 4/2002 | Beaman | H01R 9/035 174/88 R |
| 6,403,887 | B1 * | 6/2002 | Kebabjian | H01B 11/002 174/11 OR |
| 6,740,808 | B1 | 5/2004 | Chang | |
| 8,569,627 | B1 * | 10/2013 | Saiz | H01B 7/0892 174/113 R |
| 8,841,554 | B2 | 9/2014 | Gundel et al. | |
| 9,443,644 | B2 | 9/2016 | Gundel et al. | |
| 9,449,738 | B2 | 9/2016 | Gundel et al. | |
| 9,502,154 | B1 | 11/2016 | Gundel et al. | |
| 9,595,371 | B2 | 3/2017 | Gundel et al. | |
| 9,620,262 | B1 * | 4/2017 | Saiz | H01B 7/0892 |
| 9,627,106 | B2 | 4/2017 | Gundel et al. | |
| 9,666,332 | B1 | 5/2017 | Gundel et al. | |
| 9,892,823 | B2 | 2/2018 | Gundel et al. | |
| 10,056,170 | B2 | 8/2018 | Gundel et al. | |
| 10,199,141 | B2 * | 2/2019 | Chin | H01R 12/596 |
| 10,347,393 | B2 | 7/2019 | Gundel et al. | |
| 10,629,329 | B2 | 4/2020 | Gundel et al. | |
| 2002/0050386 | A1 * | 5/2002 | Aizawa | H01R 9/035 174/74 R |
| 2010/0210138 | A1 * | 8/2010 | Kuwahara | H01R 13/65914 439/607.01 |
| 2010/0307790 | A1 * | 12/2010 | Okano | H01B 7/361 174/113 C |
| 2011/0059643 | A1 * | 3/2011 | Kuwahara | H01R 12/62 439/374 |
| 2011/0100682 | A1 * | 5/2011 | Nonen | H01B 11/203 174/254 |
| 2011/0232941 | A1 * | 9/2011 | Sugiyama | H01B 11/203 174/250 |
| 2012/0024566 | A1 * | 2/2012 | Shimosawa | H01B 11/1091 174/107 |
| 2012/0285723 | A1 * | 11/2012 | Gundel | H01B 11/1869 174/113 R |
| 2013/0146327 | A1 * | 6/2013 | Gundel | H01R 13/6592 174/103 |
| 2014/0000931 | A1 * | 1/2014 | Gundel | H01B 7/0807 174/105 R |
| 2014/0014406 | A1 * | 1/2014 | Gundel | H01B 11/1869 174/350 |
| 2014/0202751 | A1 * | 7/2014 | Bugg | H05K 1/117 174/261 |
| 2014/0345903 | A1 * | 11/2014 | Gundel | H01B 11/005 174/107 |
| 2014/0360755 | A1 * | 12/2014 | Gundel | H01B 11/203 174/107 |
| 2015/0194719 | A1 * | 7/2015 | Nishimura | H01R 13/6473 333/260 |
| 2015/0310966 | A1 * | 10/2015 | Huang | H01B 11/203 174/107 |
| 2018/0190408 | A1 * | 7/2018 | Chin | H01R 12/594 |

FOREIGN PATENT DOCUMENTS

| | | |
|---|---|---|
| TW | 201209854 | 3/2012 |
| TW | M553485 | 12/2017 |

* cited by examiner

CIRCUIT BOARD ASSEMBLY AND CABLE

BACKGROUND OF THE INVENTION

1. Field of the Invention

The present invention relates to a circuit component, especially to a circuit board assembly.

2. Description of the Prior Arts

Please refer to FIG. 7 and FIG. 8. A conventional high-speed cable includes two signal lines 91, a ground line 92, and a covering material 93. The two signal lines 91 and the ground line 92 juxtapose with each other. The ground line 92 should not be located between the two signal lines 91 so that electric potentials of the two signal line 91 with respect to the ground line 92 are different, which transmits more signals. An inner layer of the covering material 93 is a conductive layer 931 and an outer layer of the covering material 93 is an isolation layer 932. Even the conductive layer 931 is electrically connected to the ground line 92, an impedance of the conductive layer 931 still affects the signal lines 91 during the signal transmission at high frequency.

Precisely, the conductive layer 931 is made from an aluminum foil spirally wound on the signal lines 91, and the spirally wound aluminum foil forms multiple loops and each loop contacts or overlaps the adjacent loop. Impedances at the contact or overlapping parts is high so that an impedance of the entire conductive layer 931 is significant, which attenuates signal intensity during transmission at high frequency (as shown in FIG. 9).

To overcome the shortcomings, the present invention provides a circuit board assembly to mitigate or obviate the aforementioned problems.

SUMMARY OF THE INVENTION

The main objective of the present invention is to provide a circuit board assembly that mitigates signal attenuation.

The circuit board assembly has at least one high-speed cable and a circuit board. Each one of the at least one high-speed cable has two signal lines, at least one ground conductor, at least one impedance-reducing conductor, and a covering material. The two signal lines are mounted through said entire high-speed cable and juxtapose with each other. Each one of the signal lines has a signal wire and an insulator wrapping the signal wire. The at least one ground conductor is mounted through said entire high-speed cable, and is located beside and juxtaposes with the two signal lines. The at least one impedance-reducing conductor is mounted through said entire high-speed cable and located between the two signal lines. The covering material wraps the two signal lines, the ground conductor, and the impedance-reducing conductor. The covering material has a conductive layer and an isolation layer. The conductive layer is an inner layer of the covering material and thus is tubular in shape, and has two ends. The conductive layer has at least one first contact area and at least one second contact area. The at least one first contact area is formed at a portion of the conductive layer (said portion contacts the at least one ground conductor) and thereby the conductive layer is electrically connected to the at least one ground conductor. The at least one first contact area extends between the two ends of the conductive layer. The at least one second contact area is formed at another portion of the conductive layer (said portion contacts the at least one impedance-reducing conductor) and thereby the conductive layer is electrically connected to the at least one impedance-reducing conductor. The at least one second contact area extends between the two ends of the conductive layer. The isolation layer is an outer layer of the covering material. The circuit board is electrically connected to one of two ends of said high-speed cable, an end of each one of the signal lines and an end of each one of the at least one ground conductor, but is separated from the at least one impedance-reducing conductor.

With the impedance-reducing conductor and the covering material electrically connected to every loop of the conductive layer, the impedance of the whole conductive layer, ground conductors, and impedance-reducing conductors is lower than an impedance of a conventional cable. As a result, the high-speed cable in accordance with the present invention will not attenuate the signal intensity during transmission. Besides, the reducing conductors are mounted in the intervals amid the signal lines and the covering material, so the sectional area of the high-speed cable still remains the same.

Other objectives, advantages and novel features of the invention will become more apparent from the following detailed description when taken in conjunction with the accompanying drawings.

DETAILED DESCRIPTION OF THE PREFERRED EMBODIMENTS

Figure 1:
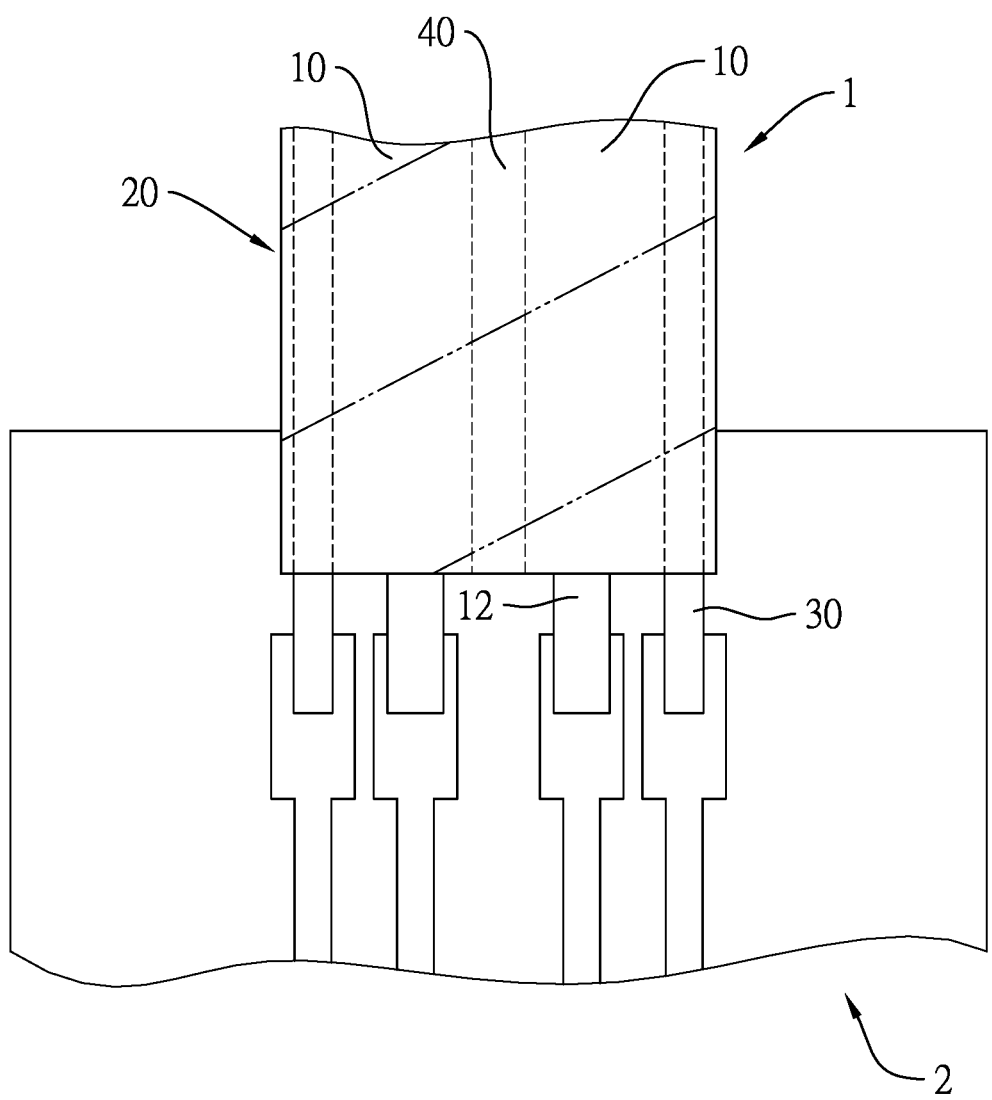
FIG. 1 is a perspective view of a circuit board assembly in accordance with the present invention.
Figure 2:
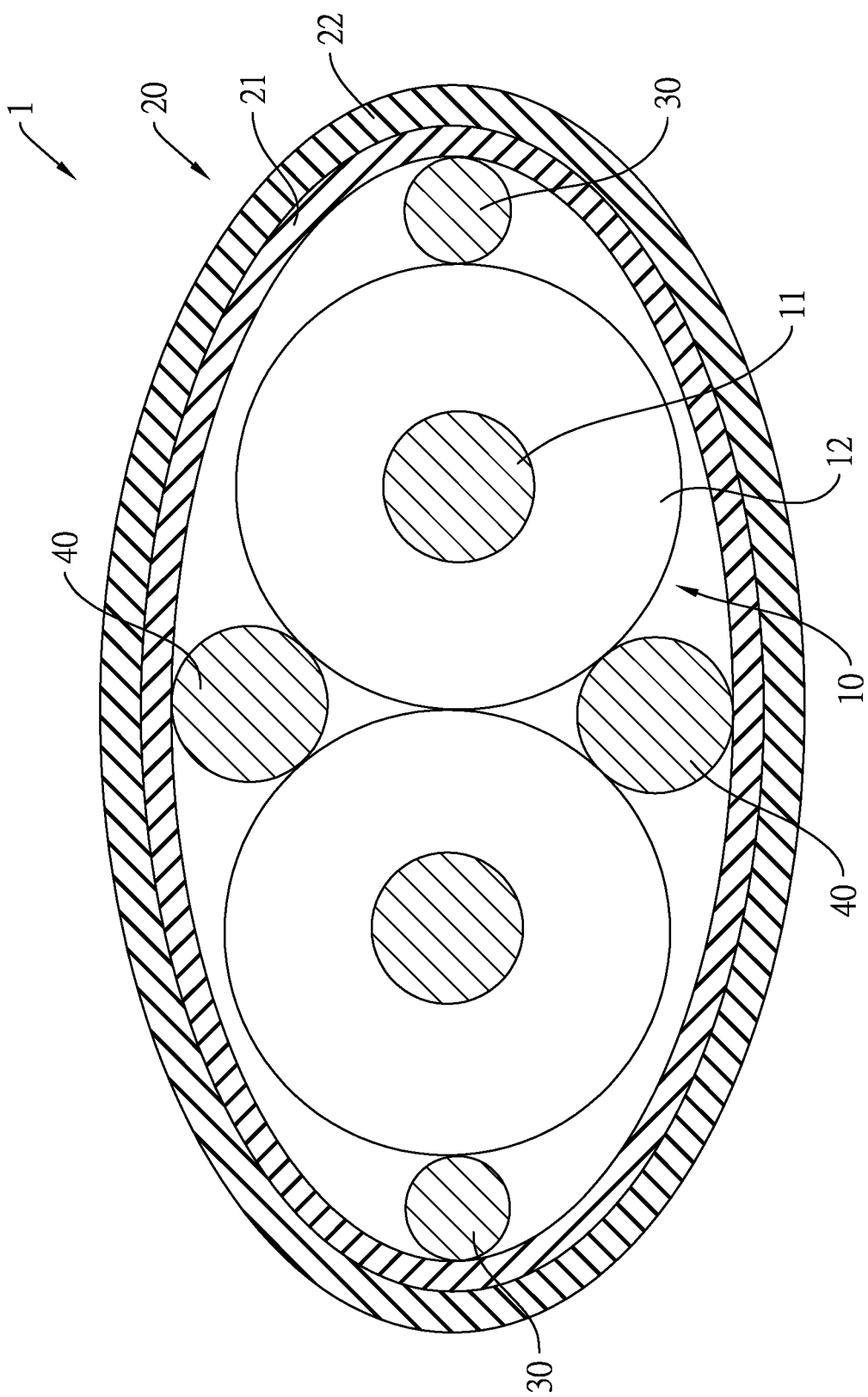
FIG. 2 is a sectional view of a first embodiment of a high-speed cable of the circuit board assembly in FIG. 1.

With reference to FIG. 1 and FIG. 2, a circuit board assembly in accordance with the present invention is provided and comprises a high-speed cable 1 and a circuit board 2.

In a first embodiment, the high-speed cable 1 comprises two signal lines 10, a covering material 20, at least one ground conductor 30, and at least one impedance-reducing conductor 40. An end of each one of the signal lines 10 and an end of the at least one ground conductor 30 may be electrically connected to copper electrodes of the circuit board 2 via welding. However, the at least one impedance-reducing conductor 40 should not be electrically connected to the circuit board 2 so the at least one impedance-reducing conductor 40 is separated from the circuit board 2. The covering material 20 wraps the two signal lines 10, and at least one interval is formed amid the signal lines 10 and the covering material 20. For example, in this embodiment, the at least one interval includes two said intervals, but it is not limited thereto. Each one of signal lines 10 is mounted through the entire high-speed cable 1 and the two signal lines 10 juxtapose with each other. Each one of signal lines 10 comprises a signal wire 11 and an insulator 12 wrapped on the signal wire 11. Two ends of each one of the signal lines 10 extend out of two ends of the covering material 20 and thereby are electrically connected to other electronic components.

The covering material 20 comprises a conductive layer 21 and an isolation layer 22. The conductive layer 21 is an inner layer of the covering material 20 and the isolation layer 22 is an outer layer of the covering material 20. The conductive layer 21 is spiral. Precisely, the conductive layer 21 may be made from an aluminum foil spirally wound on the signal lines 10. Therefore, the spirally wound aluminum foil forms multiple loops and each loop contacts or overlaps the adjacent loop, so that each two adjacent ones of the loops are electrically connected to each other. As a result, the conductive layer 21 is tubular in shape and has two ends.

In the first embodiment, the high-speed cable 1 may comprise two said ground conductors 30 and two said impedance-reducing conductors 40 and the covering material 20 wraps the two ground conductors 30 and the two impedance-reducing conductors 40. Besides, the two impedance-reducing conductors 40 are located in the two intervals amid the two signal lines 10 and the covering material 20, so a sectional area of the high-speed cable 1 is kept the same as a high-speed cable without any impedance-reducing conductor. In this embodiment, a sectional shape of the impedance-reducing conductor 40 may be a circle, a rectangle, or a narrow shape; but it is not limited thereto, as long as the impedance-reducing conductor 40 is capable of being accommodated in the interval but the sectional area of the impedance-reducing conductor 40 is kept the same. In another embodiment, an amount of the impedance-reducing conductors 40 may be three or more.

Each one of the ground conductors 30 and the impedance-reducing conductors 40 is mounted through the entire high-speed cable 1. Two ends of the ground conductors 30 may extend out of the covering material 20 and be connected to other components. Two ends of the impedance-reducing conductor 40 may not extend out of the covering material 20 because the impedance-reducing conductor 40 should not be connected to other components. The two ground conductors 30 are located on two opposite sides of the two signal lines 10 and juxtapose with the two signal lines 10. On the other hand, the two signal lines 10 are located between the two ground conductors 30, or a center of each ground conductor 30 is on an imagery line connecting centers of the two signal lines 10.

The two impedance-reducing conductors 40 are located between the two signal lines 10. Each loop of the conductive layer 21 is electrically connected to the ground conductors 30 and the impedance-reducing conductors 40. In other words, the ground conductors 30 and the impedance-reducing conductors 40 contact the conductive layer 21 in the entire high-speed cable and thereby are electrically connected to the conductive layer 21. As a result, the conductive layer 21 comprises at least one first contact area and at least one second contact area extending between the two ends of the conductive layer 21. The at least one first contact area is formed at a portion of the conductive layer 21 which contacts the at least one ground conductor 30 and thereby the conductive layer 21 is electrically connected to the at least one ground conductor 30. The at least one first contact area extends between the two ends of the conductive layer. The at least one second contact area is formed at another portion of the conductive layer 21 which contacts the at least one impedance-reducing conductor 40 and thereby the conductive layer 21 is electrically connected to the at least one impedance-reducing conductor 40.

Figure 3:
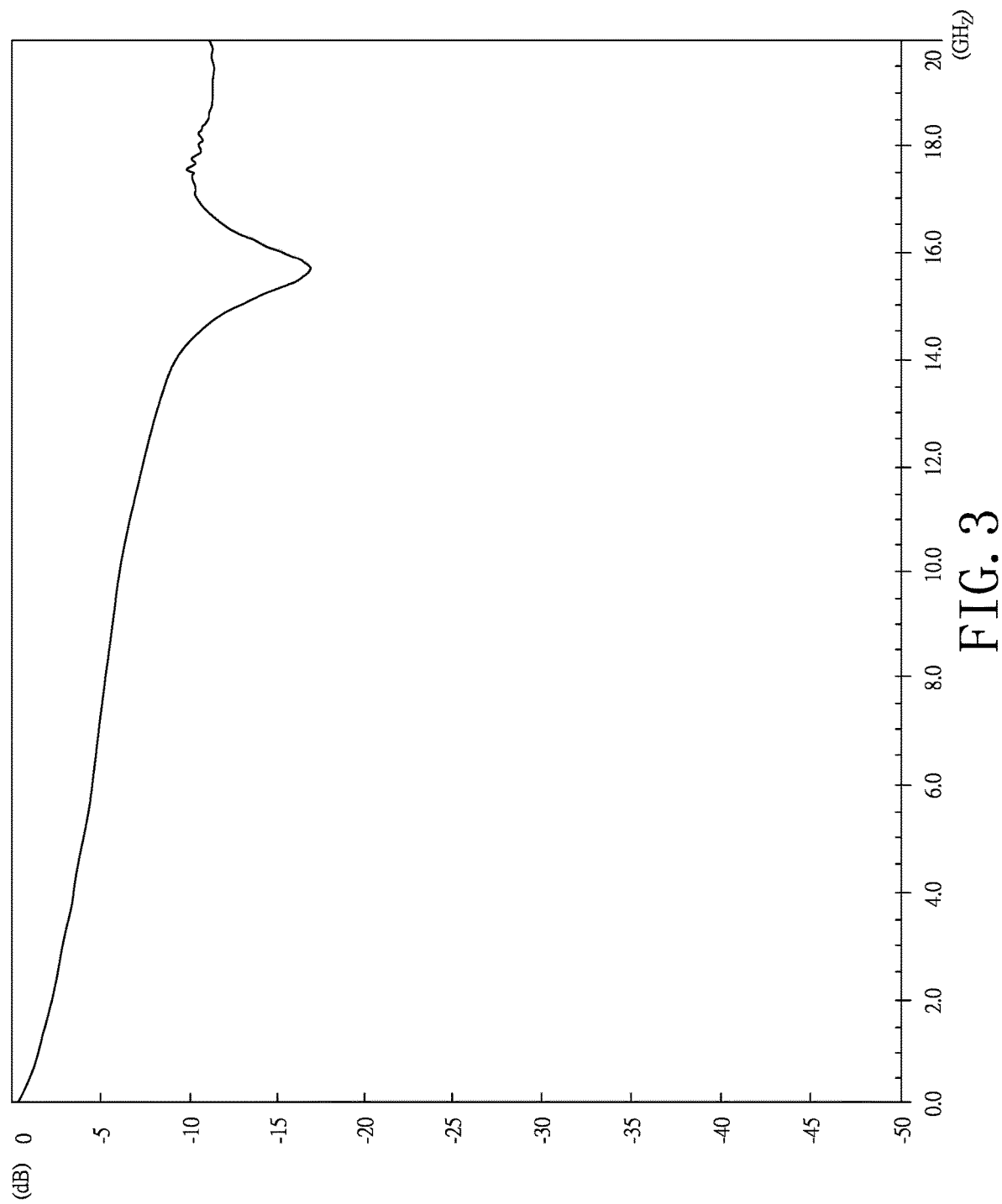
FIG. 3 is a curve chart showing a relevance between the signal attenuation and the frequency of signal to the high-speed cable in FIG. 1.

Each one of the impedance-reducing conductors 40 may be made from copper or another material with higher conductivity than that of the conductive layer 21. As a result, please also refer to FIG. 3. After every loop of the conductive layer 21 is electrically connected to the impedance-reducing conductors 40, the impedance between each two adjacent ones of the loops of the conductive layer 21 is reduced significantly, and thus an impedance of the whole conductive layer 21 and impedance-reducing conductors 40 is also reduced significantly, which mitigates signal attenuation.

Figure 4:
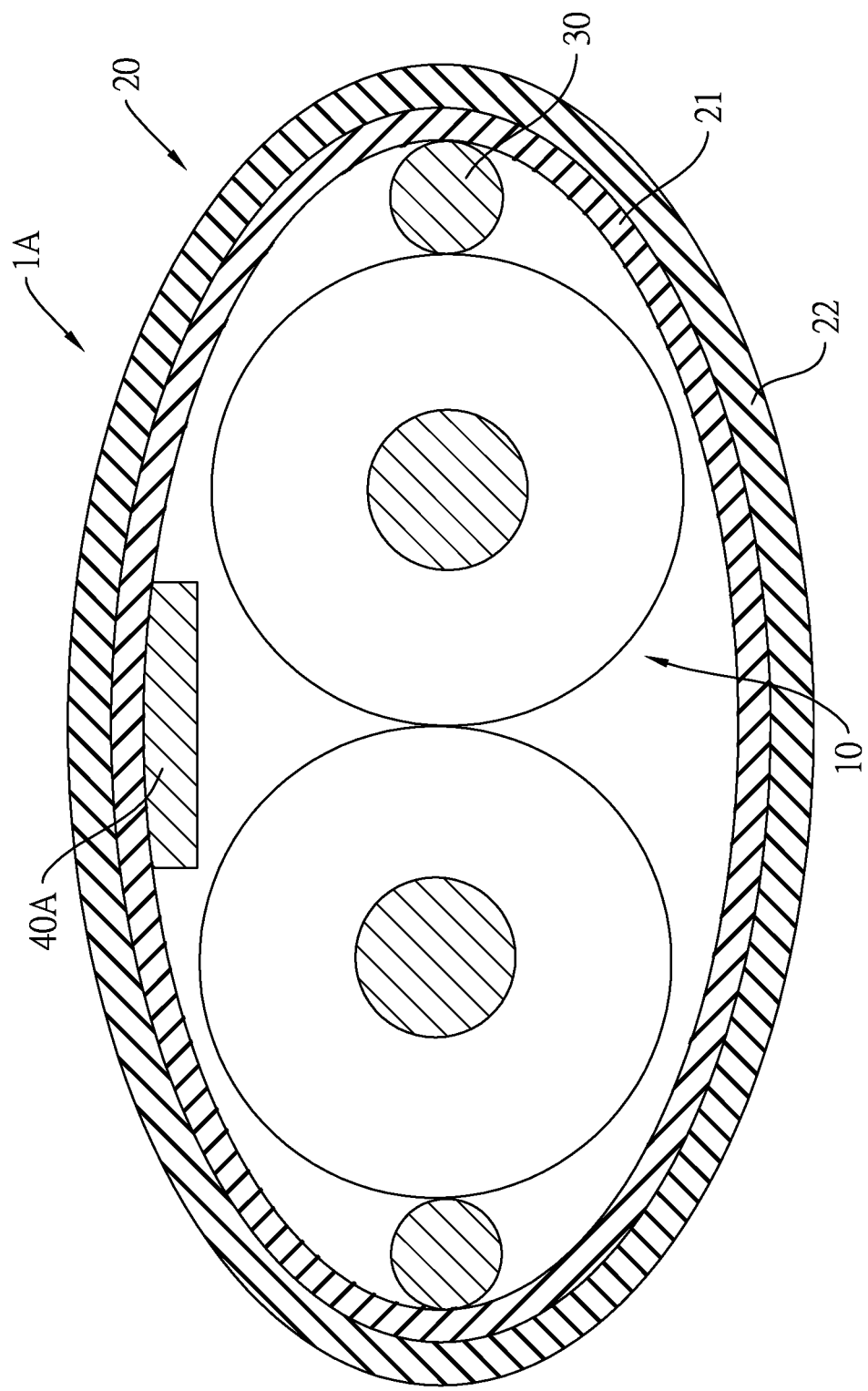
FIG. 4 is a sectional view of a second embodiment of a high-speed cable of the circuit board assembly in FIG. 1.

Then please refer to FIG. 4, which shows a second embodiment of the high-speed cable 1A in accordance with the present invention. The second embodiment is similar to the first embodiment but one of the differences is that the impedance-reducing conductor 40A is made from a sheet or a slice, so the sectional shape of the impedance-reducing conductor 40A is a narrow shape, which increases a contact area between the impedance-reducing conductor 40A and the conductive layer 21 to further reduce the impedance of the whole conductive layer 21 and impedance-reducing conductor 40A.

Figure 5:
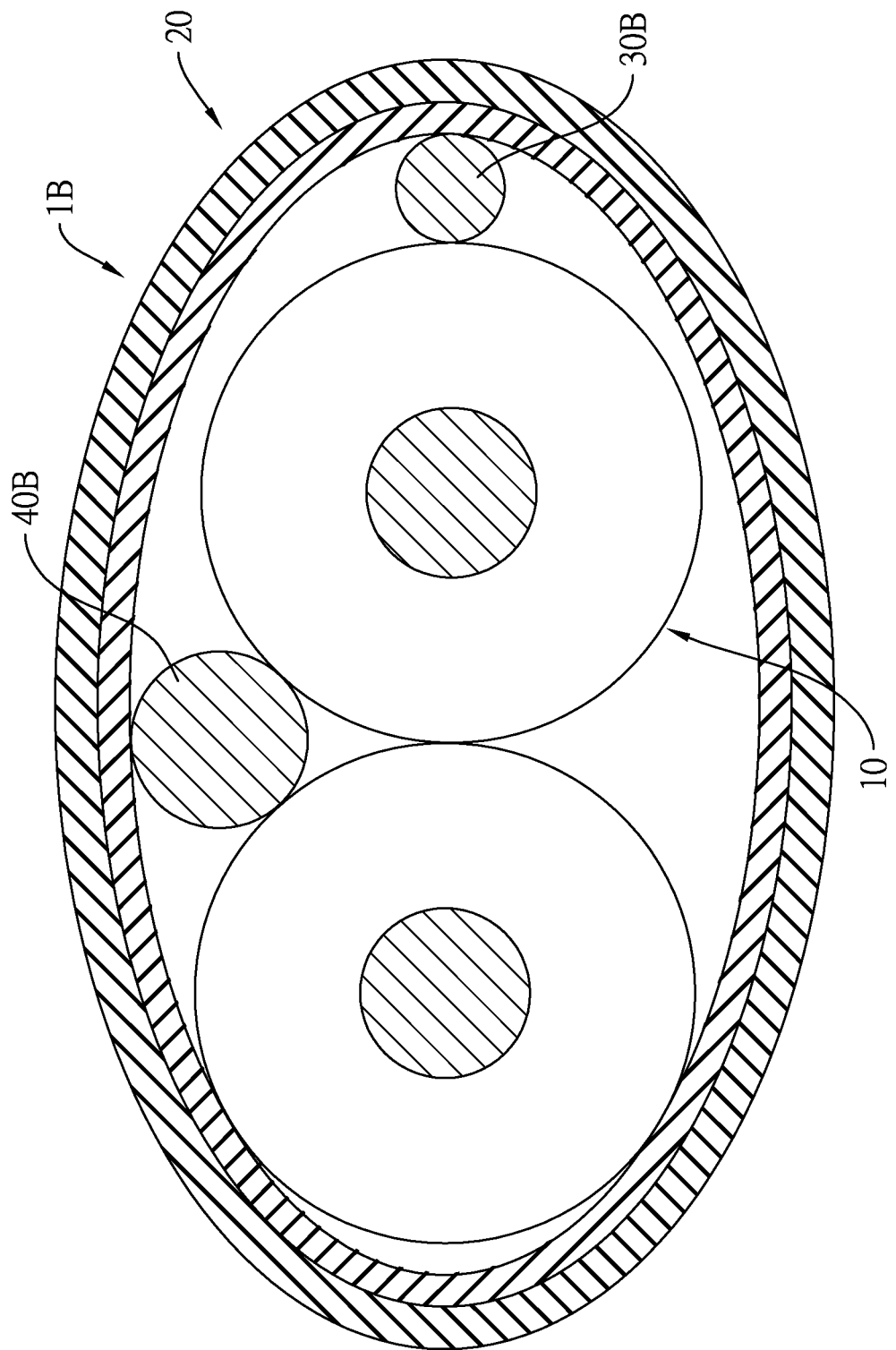
FIG. 5 is a sectional view of a third embodiment of a high-speed cable of the circuit board assembly in FIG. 1.

Then please refer to FIG. 5, which shows a third embodiment of the high-speed cable 1B in accordance with the present invention. The third embodiment is similar to the first embodiment but one of the differences is that the high-speed cable 1B may comprise only one ground conductor 30B or only one impedance-reducing conductor 40B, and thereby the high-speed cable 1B still can achieve a basic effect of reducing impedance and mitigating signal attenuation.

Figure 6:
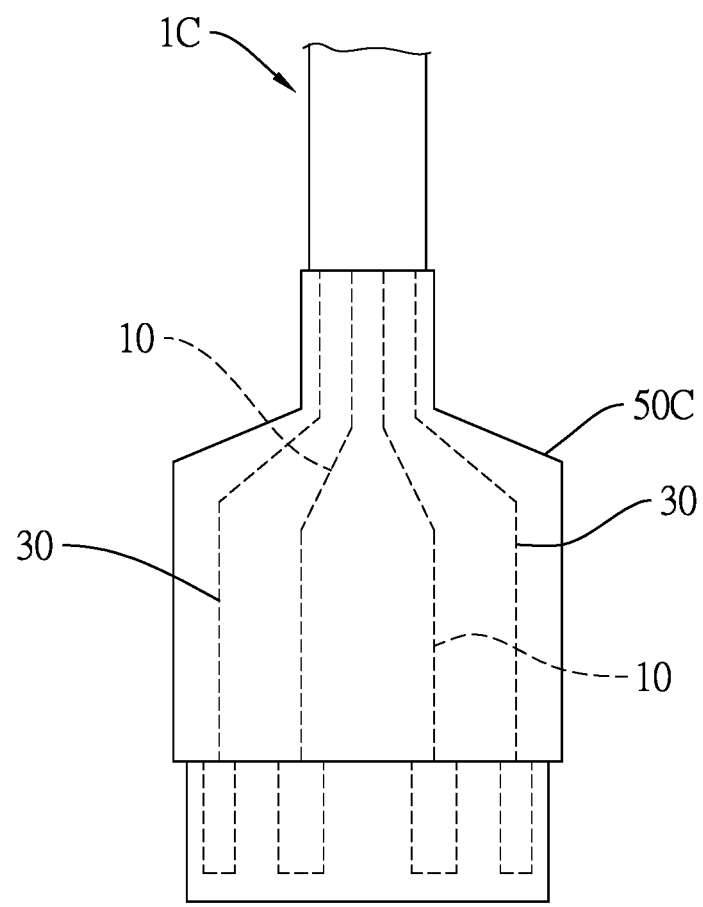
FIG. 6 is a sectional view of a fourth embodiment of a high-speed cable of the circuit board assembly in FIG. 1.
Figure 7:
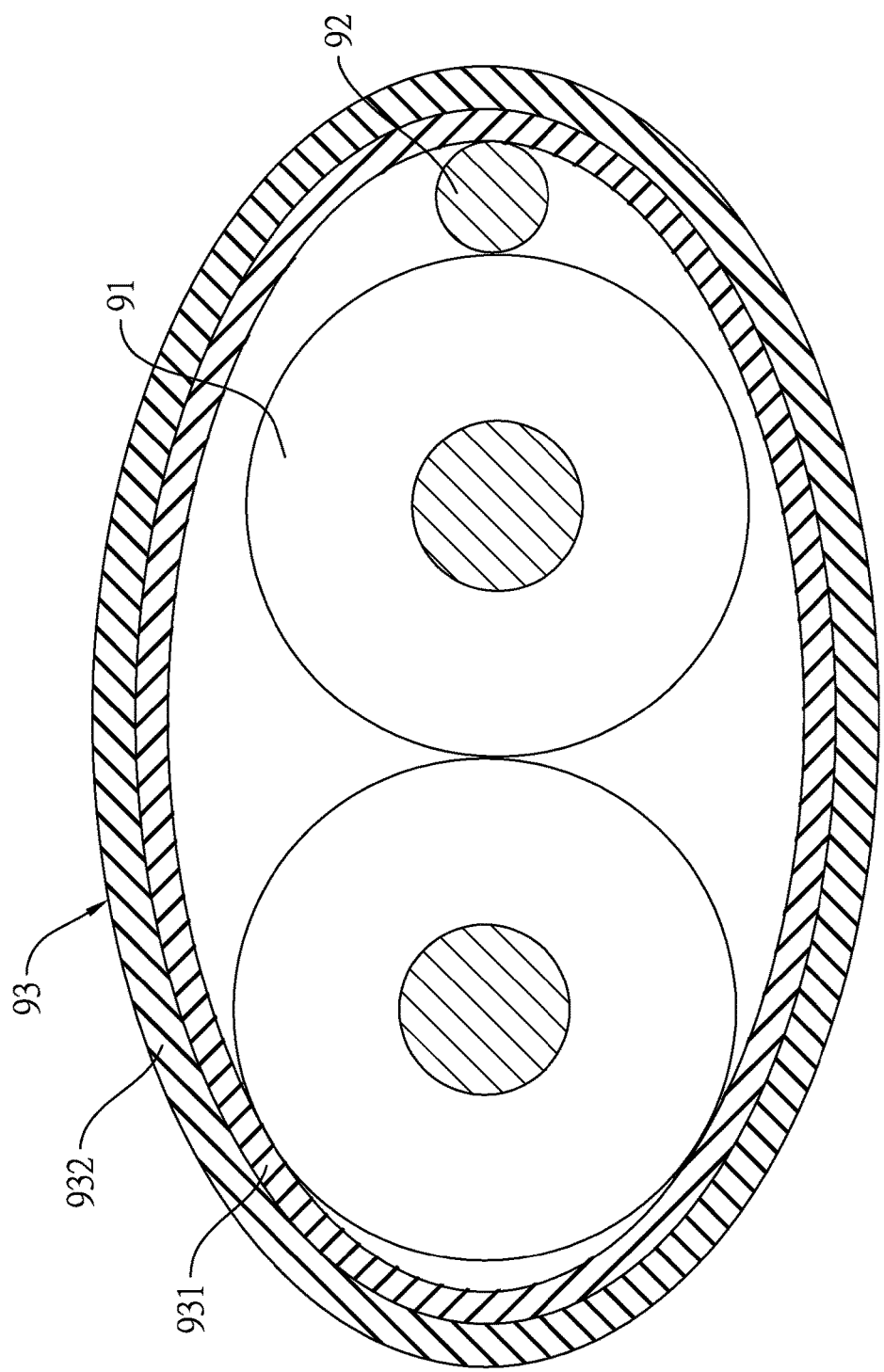
FIG. 7 is a sectional view of a conventional high-speed cable.
Figure 8:
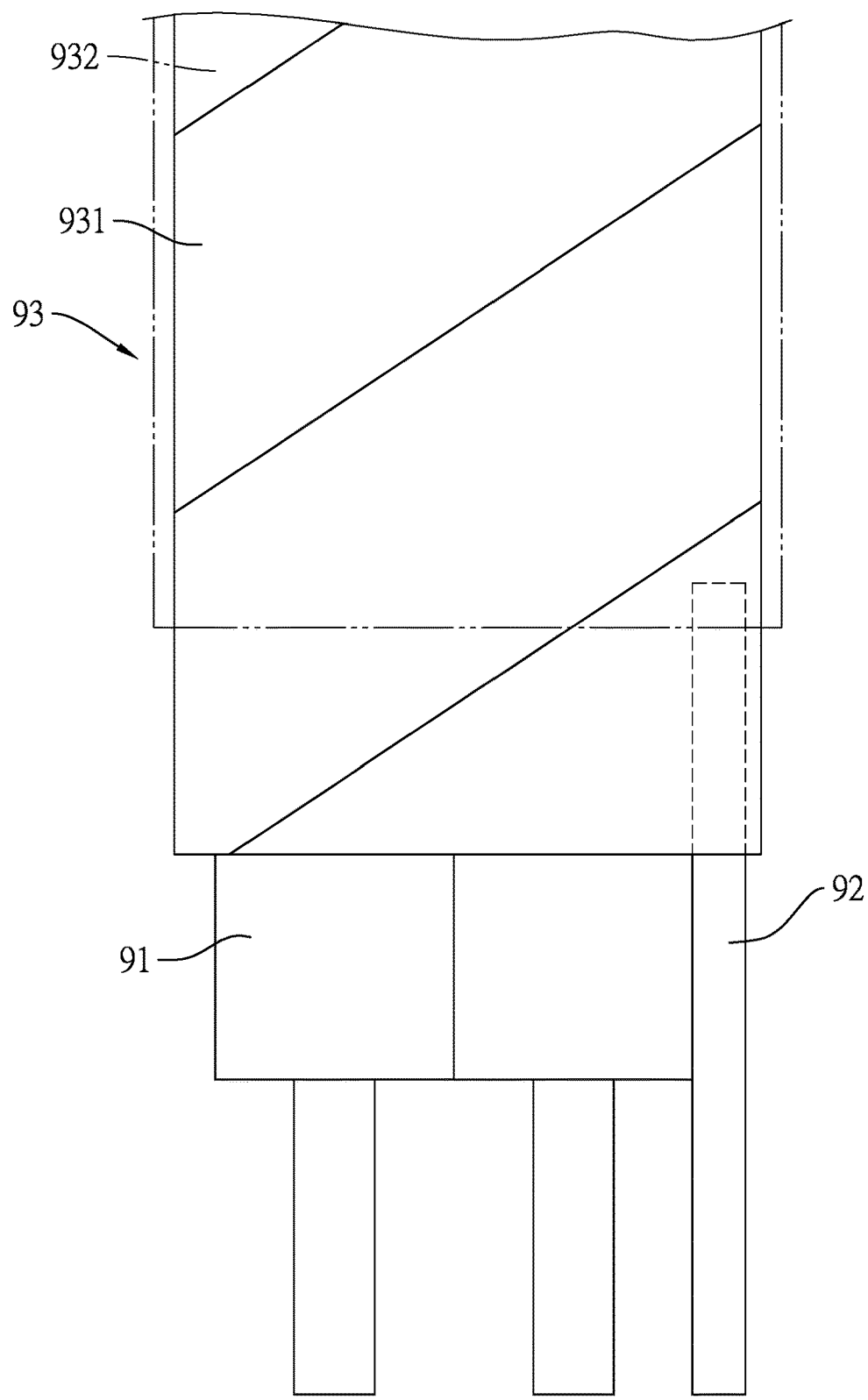
FIG. 8 is a perspective view of a conventional high-speed cable in FIG. 7.
Figure 9:
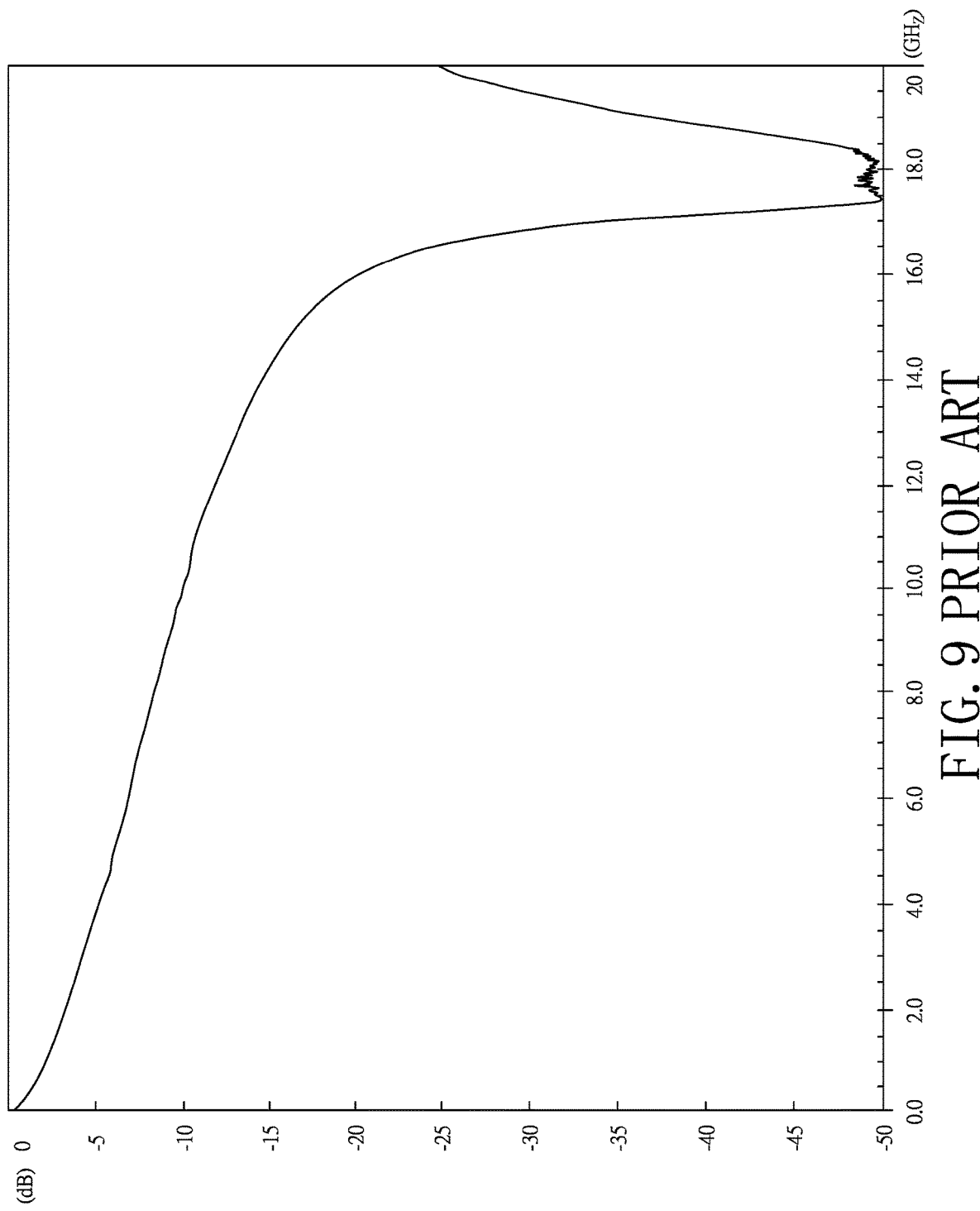
FIG. 9 is a curve chart showing a relevance between the signal attenuation and the frequency of signal to the conventional high-speed cable in FIG. 7.

Then please refer to FIG. 6, which shows a fourth embodiment of the high-speed cable 1C in accordance with the present invention. The fourth embodiment is similar to the first, second, or third embodiment but one of the differences is that the high-speed cable 1C further comprises at least one connecting terminal 50C (a plug). The connecting terminal 50C may be mounted at one end of the high-speed cable 1C. In another embodiment, the high-speed cable 1C may have two connecting terminals 50C mounted on two ends of the high-speed cable 1C and the high-speed cable 1C is connected to the circuit board (not shown in the drawings) via one of the connecting terminals 50C. The connecting terminal 50C is electrically connected to the two signal lines 10 and the ground conductor 30, and is configured to connect the signal lines 10 and the ground conductor 30 with another connector or socket. A specification and a model of the connecting terminal 50C are not limited in the present invention. The connecting terminal 50C is separated from the at least one impedance-reducing conductor (not showed in FIG. 6); in other words, the connecting terminal 50C is not electrically connected to the at least one impedance-reducing conductor.

Consequently, with the impedance-reducing conductor 40 and the covering material 20 electrically connected to every loop of the conductive layer 21, the impedance of the whole conductive layer 21, ground conductors 30, and impedance-reducing conductors 40 is lower than the impedance of a conventional cable. As a result, the high-speed cable in accordance with the present invention will not attenuate the signal intensity during transmission at high frequency. Besides, the reducing conductors 40 are mounted in the intervals amid the signal lines 10 and the covering material 20, so the sectional area of the high-speed cable 1 still remains the same.

Even though numerous characteristics and advantages of the present invention have been set forth in the foregoing description, together with details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A circuit board assembly comprising:
    at least one high-speed cable, each one of the at least one high-speed cable comprising:
        two signal lines mounted through said entire high-speed cable and juxtaposing and abutting against each other, each one of the two signal lines comprising a signal wire and an insulator wrapping the signal wire;
        a plurality of ground conductors mounted through said entire high-speed cable, and located beside and juxtaposing with the two signal lines;
        a plurality of impedance-reducing conductors mounted through said entire high-speed cable and located between the two signal lines; and
        a covering material wrapping the two signal lines, the ground conductors, and the plurality of impedance-reducing conductors, and both ends of each of the plurality of impedance-reducing conductors not extending out of the covering material; the covering material comprising:
            a conductive layer being an inner layer of the covering material and thus being tubular in shape and having two ends; the conductive layer spirally wrapping the two signal lines, the plurality of ground conductors, and the plurality of impedance-reducing conductors, the conductive layer comprising a plurality of interconnected loops, each of the plurality of interconnected loops overlapping an adjacent loop, a plurality of intervals are formed between the plurality of signal lines and the conductive layer, each of the plurality of intervals accommodating at least one of the plurality of impedance-reducing conductors, the conductive layer contacting with the plurality of ground conductors and the plurality of impedance-reducing conductors simultaneously, the conductive layer comprising a first contact area and a second contact area, the first contact area formed at a portion, contacting the plurality of ground conductors, of the conductive layer and thereby the conductive layer electrically connected to the plurality of ground conductors; the first contact area extending between the two ends of the conductive layer; and the second contact area formed at another portion, contacting the plurality of impedance-reducing conductors, of the conductive layer and thereby the conductive layer electrically connected to the plurality of impedance-reducing conductors; the second contact area extending between the two ends of the conductive layer; and
            an isolation layer being an outer layer of the covering material; and
    a circuit board electrically connected to one of two ends of the at least one high-speed cable, an end of each one of the signal lines and an end of each one of the ground conductors, separated from the plurality of impedance-reducing conductors.

2. The circuit board assembly as claimed in claim 1, wherein a sectional area of each of the plurality of impedance-reducing conductors is a circle and a diameter of each of the plurality of ground conductors is smaller than a diameter of each of the plurality of impedance-reducing conductors respectively, the isolation layer being formed by one piece.

3. The circuit board assembly as claimed in claim 1, wherein the other end of the at least one high-speed cable is connected to a plug, the plug is electrically connected to the plurality of signal lines and the plurality of the ground conductors and the plug is separated from the plurality of impedance-reducing conductors.

4. The circuit board assembly as claimed in claim 1, wherein a sectional area of each of the plurality of impedance-reducing conductors is a rectangle.

5. A cable, comprising:
    a plurality of signal lines being arranged in a row, the plurality of signal lines extending along a longitudinal direction;
    a plurality of ground conductors being arranged in the row, the plurality of ground conductors extending along the longitudinal direction;
    a plurality of impedance-reducing conductors; and
    a conducting layer being tubular-shaped and formed of at least one metal foil, the conducting layer comprising a plurality of interconnected loops, each of the loops overlapping an adjacent loop, the conducting layer spirally wrapping the plurality of signal lines, the plurality of ground conductors, and the plurality of impedance-reducing conductors, both ends of each of the plurality of impedance-reducing conductors not extending out of the conducting layer.

6. The cable as claimed in claim 5, wherein a sectional area of at least one of the plurality of impedance-reducing conductors is a rectangle.

7. A circuit board assembly comprising:
    a cable as claimed in claim 5; and
    a circuit board electrically connected to one of two ends of the cable, an end of each of the plurality of signal lines and an end of each of the plurality of ground conductors, the circuit board being separated from the plurality of impedance-reducing conductors.

* * * * *